United States Patent [19]

Magdo

[11] 3,900,344

[45] Aug. 19, 1975

[54] NOVEL INTEGRATABLE SCHOTTKY BARRIER STRUCTURE AND METHOD FOR THE FABRICATION THEREOF

[75] Inventor: Ingrid E. Magdo, Hopewell, N.Y.

[73] Assignee: IBM Corporation, Armonk, N.Y.

[22] Filed: Mar. 23, 1973

[21] Appl. No.: 344,455

[52] U.S. Cl. .................... 148/1.5; 427/84; 357/15; 357/71; 29/576

[51] Int. Cl. .................... B44d 1/18; H01l 11/00

[58] Field of Search...... 317/235 UA; 117/217, 200, 117/227, 212, 62, 118; 357/71, 15; 148/1.5

[56] References Cited

UNITED STATES PATENTS

| | | | |
|---|---|---|---|
| 3,274,670 | 9/1966 | Lepselter | 117/118 |
| 3,506,893 | 4/1970 | Dhaka | 317/235 UA |
| 3,604,986 | 9/1971 | Lepselter | 317/235 UA |
| 3,629,022 | 12/1971 | Terry | 357/71 |
| 3,632,436 | 1/1972 | Denning | 117/212 |
| 3,642,528 | 2/1972 | Kimura | 117/212 |
| 3,698,941 | 10/1972 | Nobel | 117/212 |
| 3,699,408 | 10/1972 | Shinoda | 317/235 UA |
| 3,753,774 | 8/1973 | Veloric | 117/217 |

OTHER PUBLICATIONS

Hosack, Applied Physic Letter, Vol. 21, September 1972, pg. 256–257.

*Primary Examiner*—Michael F. Esposito
*Attorney, Agent, or Firm*—J. B. Kraft

[57] ABSTRACT

A novel Schottky Barrier structure which is integratable with standard integrated circuits comprising a metal layer of $Al_2Pt$ in contact with a high resistivity semiconductor region. The structure is fabricated by first forming a platinum silicide layer on said silicon substrate and then applying a metallic layer comprising aluminum on said first layer, after which the structure is sintered at a temperature of at least 400°C. for at least an hour.

10 Claims, 9 Drawing Figures

NOVEL INTEGRATABLE SCHOTTKY BARRIER STRUCTURE AND METHOD FOR THE FABRICATION THEREOF

BACKGROUND OF THE INVENTION

The present invention relates to Schottky Barrier devices, and more particularly to Schottky Barrier devices which are readily integratable into integrated semiconductor circuits.

Surface barrier devices utilizing the Schottky effect based upon the rectifying characteristics exhibited by a metal-to-semiconductor interface are well known. Sch.ttky Barrier diodes, also called "hot carrier" diodes have been recognized to exhibit fast switching speeds as well as relatively low forward barrier or turn-on voltages. Accordingly, the desirability of utilizing Schottky Barrier devices in integrated monolithic circuits has been recognized in the art. The two most desirable uses of Schottky Barrier diodes has been purely as clamps or shunts across PN semiconductor junctions as well as for storage purposes in Schottky Barrier diode monolithic memory array integrated circuits. The primary advantage of Schottky Barrier diodes over other diodes has been their relatively low forward barrier characteristics. Because of such low forward barrier characteristics, Schottky Barrier diode clamps may be used to prevent transistor saturation and thereby to provide faster turn-off time for digital circuitry, and faster switching speeds. Also, such diodes require less voltage when used in memory arrays, thereby having minimal heat and power dissipation problems.

One extensively used metallurgy for providing the ohmic contacts and interconnections in present integrated circuitry involves the use of a layer of platinum silicide in the contact holes making direct contact with the silicon substrate and a layer of aluminum over the platinum silicide. This layer of aluminum is coextensive with an aluminum layer pattern on the insulative layer over the semiconductor substrate which provides the interconnections. The reason that platinum silicide has been used in the contact holes is that aluminum has been found to make less than satisfactory direct ohmic contacts with silicon semiconductor substrates.

While such composite metallurgies of aluminum layers over platinum silicide have been extensively used in integrated circuits involving ohmic contacts and even suggested for usage in circuitry involving both ohmic and Schottky Barrier contacts (see U.S. Pat. No. 3,506,893), problems have been encountered and anticipated in the use of such a metallurgy in the more advanced integrated circuitry. Because such advanced circuitry requires greater device and metallization density, faster switching times and lower power dissipation, platinum silicide Schottky Barrier contacts are considered to be less than satisfactory for the following reasons. First, a Schottky Barrier contact with silicon substrate has a forward barrier height in the order of 0.80eV (electron volts). This is a relatively high forward barrier height for a Schottky diode and will tend to decrease switching speeds. Of course, these higher barrier heights could be compensated for by increasing the contact area which would reduce the over-all voltage level required to render the Schottky Barrier diode conductive and thereby increase the switching speed. However, the relatively large area required for a plurality of such contacts would go contrary to the greater device and wiring densities required of advanced integrated circuits. Likewise, when used in Schottky Barrier diode memory arrays, the greater forward voltage requirements of the platinum silicide Schottky contacts are contrary to the direction in the memory array art of reducing the voltage requirements and thereby minimizing heat and power dissipation problems.

A possible solution for the problem presented by platinum silicide Schottky Barrier contacts in advanced integrated circuitry has been a metallurgical system wherein the metallurgy in the ohmic contacts and the Schottky Barrier contacts are formed in two separate steps. For example, the platinum silicide can first be formed only in the ohmic contact openings with the Schottky Barrier contact openings being masked off or closed during this step. Then, the Schottky Barrier contact openings are formed and aluminum deposited which forms the standard platinum silicide layer-aluminum layer metallurgy in the ohmic contacts and only an aluminum layer in the Schottky Barrier contacts. This does significantly reduce the forward barrier height of the Schottky contacts because aluminum has a forward barrier height in the order of 0.72eV. However, it does involve an additional processing step which the art would like to avoid if possible.

SUMMARY OF THE PRESENT INVENTION

Accordingly, it is a primary object of the present invention to provide an integrated semiconductor circuit structure having Schottky Barrier diodes of very low forward barrier heights.

It is another object of the present invention to provide such integrated circuits having Schottky Barrier diodes of very low forward barrier heights which permit maximum metallization and device densities.

It is a further object of the present invention to provide an integrated semiconductor circuit structure utilizing Schottky Barrier diodes having relatively high circuit switching speeds.

It is yet a further object of the present invention to provide an integrated semiconductor circuit memory array utilizing Schottky Barrier diodes, which array has high device density and low power and heat dissipation requirements.

It is even another object of the present invention to provide a method for fabricating an integrated circuit structure fulfilling the preceding objects in a method wherein both ohmic and Schottky Barrier contacts are formed by the same processing steps.

In accordance with the present invention, there is provided in an integrated circuit, a Schottky Barrier device structure comprising $Al_2Pt$ in contact with the semiconductor substrate. The portion of the semiconductor substrate which is contacted has a maximum conductivity-determining impurity $C_0$ of $10^{18}$ atom/cm$^3$. Preferably, the integrated circuit structure also has ohmic contacts of the same $Al_2Pt$ metallurgy with the ohmic contacts being to regions having a conductivity-determining $C_0$ of at least $10^{19}$ atom/cm$^3$.

In accordance with a further aspect of the present invention, there is provided a novel method for forming the above-described Schottky Barrier integrated circuit structure. In accordance with this method, a layer of platinum silicide is first formed on a silicon substrate having a maximum conductivity-determining impurity $C_0$ of $10^{18}$ atom/cm$^3$. Then, an aluminum layer is applied over the platinum silicide layer, and the structure is sintered at a temperature of at least 400°C. for at least 1 hour. Most preferably, the sintering is carried out at about 450°C. for about 2 hours. As a result of this sintering, the platinum silicide and the aluminum interreact, and a novel Schottky Barrier contact comprising $Al_2Pt$ is formed in situ. Surprisingly, this novel $Al_2Pt$ Schottky Barrier contact has a forward barrier height of 0.69eV which is lower than both the platinum silicide (0.80eV) and the aluminum (0.72eV) layers from which the metallurgy was formed.

With the present method, the ohmic contacts may be formed simultaneously with the Schottky Barrier contacts and contain identical metallurgy. Thus, the $Al_2Pt$ contacts of the present invention do not require additional processing steps to deposit the Schottky Barrier metallurgy separate from the deposition of the ohmic contact metallurgy. In addition, the low forward barrier height of the Schottky Barrier contacts of the present invention give relatively high speed circuit switching times with minimum area Schottky Barrier contacts. In array structures, because of the low forward barrier characteristics, even power dissipation is minimized.

The foregoing and other objects, features and advantages of the invention will be apparent from the following more particular description and preferred embodiments of the invention as illustrated in the accompanying drawings.

BRIEF DESCRIPTION OF THE DRAWINGS

FIGS. 1C' and 1D' are diagrammatic, cross-sectional views of a portion of an integrated circuit illustrating variations in the steps shown in FIGS. 1C and 1D.

With reference to FIG. 1A, openings 10 and 11 are formed in dielectric layer 12 covering silicon substrate 13 having N+ region 14 with a $C_0$ of $10^{20}$ abutting contact opening 10 and N- region 15 with a $C_0$ of $5 \times 10^{16}$ abutting opening 11. The structure shown in FIG. 1A may be fabricated by any process known in the art for fabricating such planar integrated circuit structures, e.g., the method described in U.S. Pat. No. 3,539,876. Dielectric layer 10, which for the present embodiment will be silicon dioxide having a thickness of approximately 2500A, may be any other dielectric insulative layer conventionally used in integrated circuits, e.g., silicon nitride, or a composite of silicon nitride on silicon dioxide. In the following method, a Schottky Barrier contact will be formed in opening 11 simultaneously with the formation of an ohmic contact in opening 10. The final structure will be a Schottky Barrier diode which utilizes the ohmic contact formed in opening 10 in the path leading to one side of the Schottky Barrier junction.

Figures 1A, 1B, 1C, 1D:
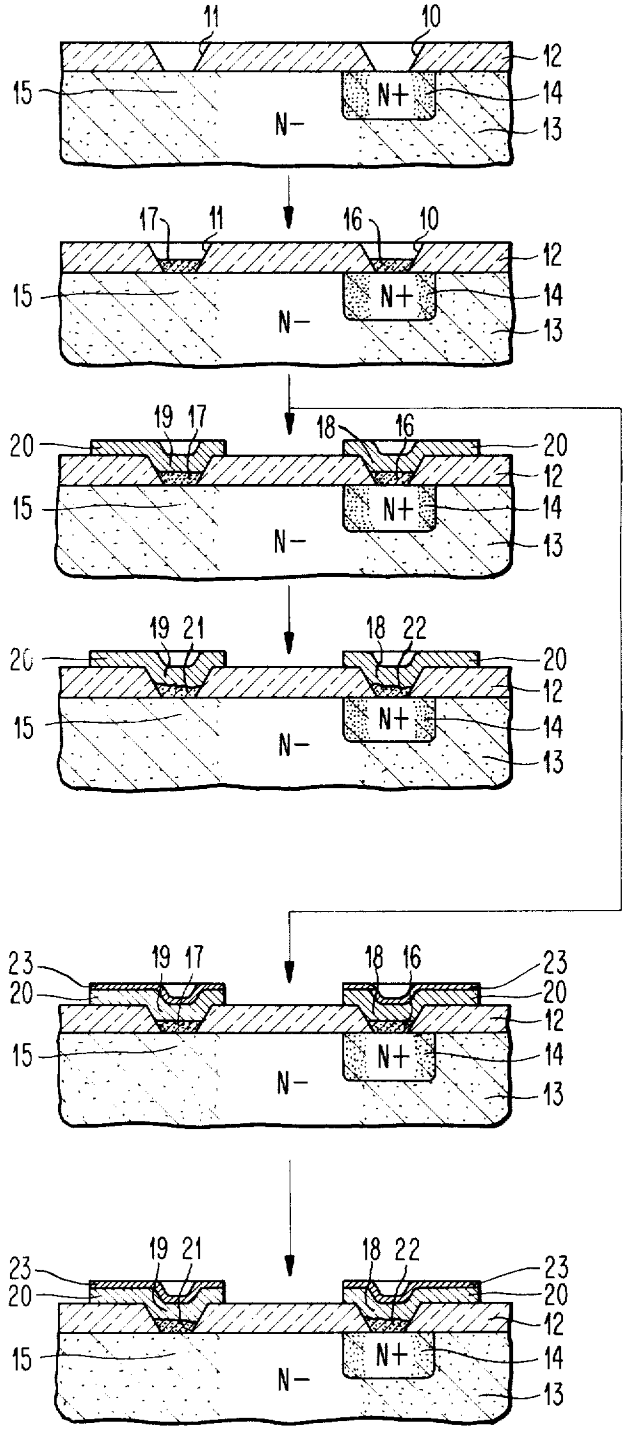
FIGS. 1A-1D is a diagrammatic, cross-sectional view of a portion of an integrated circuit illustrating the steps involved in the method of the present invention to fabricate the Schottky Barrier structures of the present invention simultaneously with ohmic contacts.

First, utilizing any conventional deposition technique, such as sputtering or preferably vapor deposition, a thin layer of platinum in the order of 500A is deposited over the entire surface of dielectric layer 12 and in openings 10 and 11. The substrate is then sintered in an inert atmosphere at a temperature of about 550°C. for a period of 20 minutes. The sintering operation produces an alloying of the platinum in holes 10 and 11 with the exposed silicon of substrate 13 to form platinum silicide, while the remainder of the platinum remains unaffected. The remaining or unalloyed platinum is then removed by suitable means, such as selective etching with an etchant, e.g., aqua regia, which will remove the platinum without affecting the platinum silicide in the holes. The resulting structure is illustrated in FIG. 1B with platinum silicide layers 16 and 17 respectively formed in holes 10 and 11. Next, a layer of aluminum, about 8000A to 10,000A in thickness is deposited over the entire surface including layers 16 and 17, after which, by conventional selective photoresist etching, portions of the deposited aluminum layer are removed leaving an aluminum pattern comprising aluminum layers 18 and 19 respectively over layers 16 and 17 in the contact openings, as well as aluminum layers 20 on the surface of insulative layer 12 which form the conductive interconnection paths between devices and regions in the integrated circuit; this structure is shown in FIG. 1C.

At this stage, platinum silicide contact 17, which is the Schottky Barrier contact, has a forward barrier characteristic of 0.80eV. Next, the structure is sintered at a temperature of at least 400°C. for a period of at least 1 hour. Preferably, the sintering temperature should not exceed 550°C. because above this temperature, there appears to be a tendency towards migration from aluminum in layer 20 into substrate 13 which is difficult to control even by a silicon overlay technique which will be subsequently described. In any event, with the metallization layers described above, best results may be achieved by conducting the sintering at a temperature of about 450°C. for about 2 hours. As a result of this sintering, a reaction takes place between the two layers, whereby an aluminum platinum product, $Al_2Pt$, is formed at both the Schottky Barrier contact in hole 11 and the ohmic contact in hole 10. This resulting composition has been found to have a forward barrier height of 0.69eV which is unexpected in view of the fact that both aluminum (0.72eV) and platinum silicide (0.80eV) have higher forward barrier heights.

The final structure is shown in FIG. 1D wherein the Schottky contact is designated 21 and the ohmic contact is designated 22.

The results appear to be the same even if instead of a top layer of aluminum, there is used a layer comprising 95% or more of aluminum plus up to 5% of copper. The added copper is utilized in aluminum metallization to enhance the current-carrying characteristics of such metallization.

Thus, by the technique described above, a Schottky Barrier structure having a very low forward barrier height may be fabricated simultaneously with the ohmic contact. In order that the respective contacts may function as Schottky Barrier and ohmic contact, region 14 should preferably have a conductivity-determining $C_0$ of at least $10^{19}$ atoms/cm$^3$ and region 15 should have a maximum conductivity-determining $C_0$ of $10^{18}$ atoms/$cm^3$.

Because of the temperature time cycle involved in the sintering operation of the present invention, the possibility exists that sufficient penetration of the contact metallurgy, and particularly the aluminum layer, may take place into the silicon body to either short out junctions in the body if such are relatively shallow or to constrict cross-sectional area of the contact metallurgy to a point that metallurgy is more prone to failure by electromigration. Such aluminum silicon diffusion problems are known in the art and are discussed in U.S. Pat. No. 3,382,568, as well as in copending patent application Ser. No. 310,318, Greer et al., filed Nov. 29, 1972. Should this problem become sufficiently pronounced in the practice of the invention, it can be readily solved through the expedient of a silicon overlay layer as set forth in FIGS. 1C' and 1D' which are then carried out instead of the procedure shown in FIGS. 1C and 1D. Subsequent to the deposition of the aluminum layer and prior to the etching of said aluminum layer, a thin layer of polycrystalline silicon, in the order of from 50A to 250A in thickness is deposited over the aluminum layer. Then, using standard methods for etching, the silicon overlay may be individually etched or etched collectively with the aluminum layer to produce the same metallization interconnector pattern as shown in FIG. 1C, except that there is a silicon layer 23 overlaying the aluminum layers, FIG. 1C'. This silicon layer serves the function of a silicon source from the aluminum layer and prevents any significant undesirable penetration of aluminum into the substrate 13. The silicon overlay layer serves this function as long as sintering temperatures do not exceed 550°C. and definitely remain below 577°C. When such a silicon overlay layer is used, the final structure is as shown in FIG. 1D' instead of FIG. 1D.

Figure 2A:
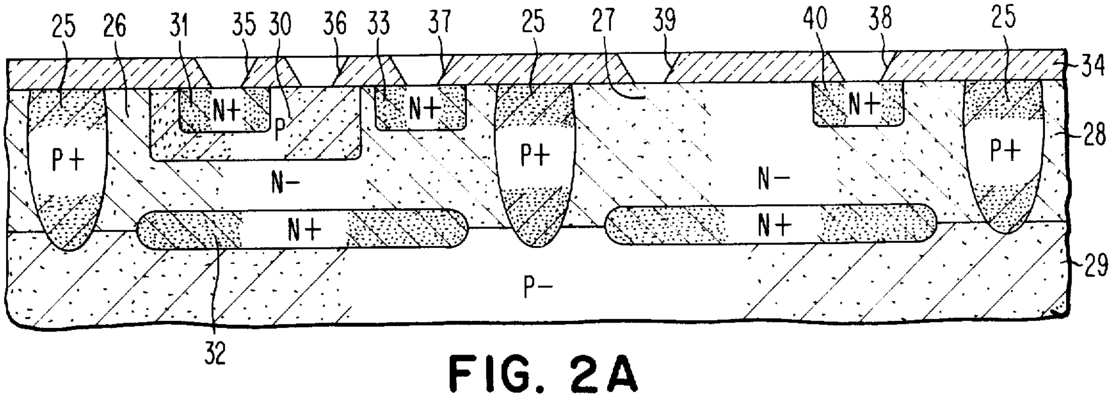
FIGS. 2A and 2B are diagrammatic, cross-sectional views of a portion of an integrated circuit structure illustrating selected steps in the fabrication of junction isolated integrated circuits containing the Schottky Barrier contacts of the present invention.
Figure 2B:
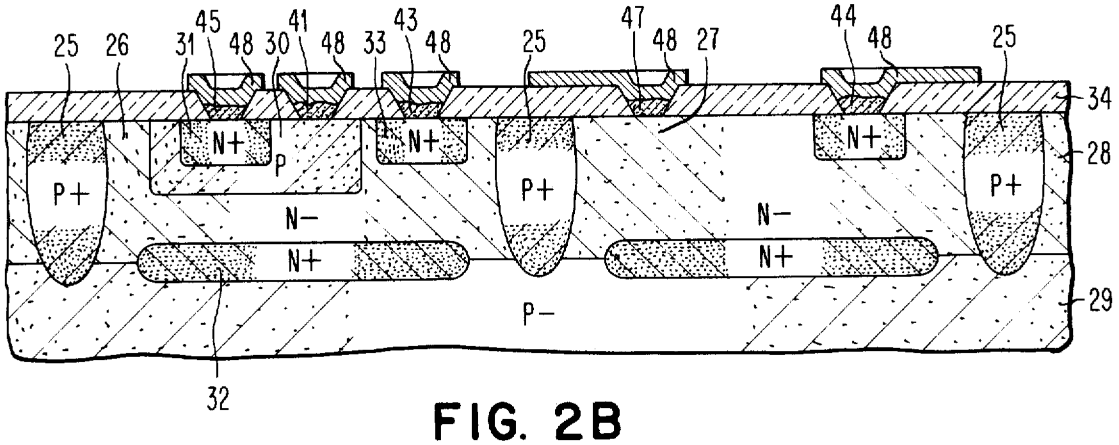

With reference to FIGS. 2A and 2B, there will now be briefly described the utilization of the process described above in FIGS. 1A through 1D for the fabrication of Schottky Barrier devices in a junction isolated integrated circuit. Utilizing conventional planar integrated circuit fabrication techniques, for example, those described in U.S. Pat. No. 3,539,876, the structure shown in FIG. 2A is formed wherein isolation region 25 respectively isolates regions 26 and 27 of an N− silicon epitaxial layer 28 formed on a P− silicon substrate 29. An NPN transistor comprising P base region 30, N+ emitter region 31, collector region 26, N+ collector contact 33 and N+ buried subcollector 32 are formed in one isolated pocket while the Schottky Barrier device is to be formed in the other isolated pocket 27. A silicon dioxide insulating layer 34, which is formed over the planar surface of the structure, has the following openings: Opening 35 in which an ohmic contact is to be made to N+ emitter region 31 which has a conductivity-determining impurity $C_0$ of $10^{21}$; opening 36 in which an ohmic contact is to be made to P type base region 30 which has a conductivity-determining impurity $C_0$ of $10^{19}$; opening 37 in which an ohmic contact is to be made to collector contact N+ region 33 which has a conductivity-determining impurity $C_0$ of $10^{21}$; opening 38 in which an ohmic contact is to be formed to N+ region 40 having a conductivity-determining impurity $C_0$ of $10^{21}$ to provide the contact path to the Schottky Barrier device, and opening 39 in which there is to be deposited a Schottky Barrier contact to N− region 27 which has a conductivity-determining impurity $C_0$ of $5 \times 10^{16}$. Next, following the procedures set forth in FIGS. 1A through 1D, through the completion of the sintering step, the structure shown in FIG. 2B is formed wherein $Al_2Pt$ metallization layers 45, 41, 43 and 44 respectively form ohmic contact with regions 31, 30, 33 and 40, while $Al_2Pt$ metallization layer 47 forms a Schottky Barrier contact with region 27. The aluminum metallization layers 48 cover the $Al_2Pt$ layers in the opening and provide the conductor interconnection pattern on the surface of insulative layer 34.

Figure 3:
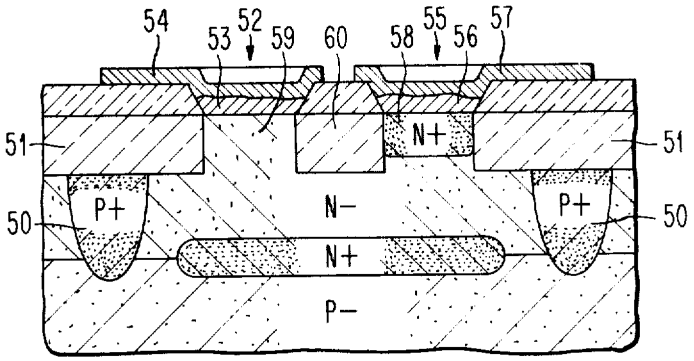
FIG. 3 is a diagrammatic, cross-sectional view of a portion of an integrated circuit utilizing the Schottky Barrier structures of the present invention in a recessed oxide isolated integrated circuit configuration.

While the Schottky Barrier structure of the present invention may be integrated in junction isolated structures as described with respect to FIGS. 2A and 2B, it may also be readily incorporated into integrated circuit structures utilizing other forms of isolation. The structure portion shown in FIG. 3 is equivalent to the portion of the structure of FIG. 2B which contains the Schottky Barrier contact except that instead of junction isolation, there is used a combination of junction isolation and recessed dielectric, particularly silicon dioxide isolation as described in copending application Ser. No. 150,609, I. Magdo et al., filed Jun. 7, 1971. In the structure, the isolation is formed by a combination of P+ isolation region 50 and recessed silicon dioxide pocket 51. Schottky Barrier contact 52 comprises a composite of $Al_2Pt$ layer 53 and aluminum top layer 54, while ohmic contact 55 comprises a composite of $Al_2Pt$ layer 56 and aluminum layer 57. N+ region 58, to which the ohmic contact is made, has a conductivity-determining impurity $C_0$ of $10^{21}$, while N− region 59, to which the Schottky Barrier contact is made, has a conductivity-determining impurity $C_0$ of $5 \times 10^{16}$. It is to be noted that N+ region 58 is defined by the combination of isolating recessed silicon dioxide pocket 51 and recessed silicon dioxide pocket 60.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A method of forming Schottky-Barrier contacts to a silicon surface comprising
   - depositing a layer consisting essentially of platinum on said surface,
   - heating to form a platinum silicide layer on a silicon substrate having a maximum conductivity-determining impurity $C_0$ of $10^{18}$ atoms/$cm^3$,
   - depositing a metallic layer consisting essentially of aluminum on said platinum silicide layer, and
   - sintering the substrate at a temperature in the order of from 400° to 550°C. for at least 1 hour.

2. The method of claim 1 wherein said substrate is N type.

3. The method of claim 2 wherein said sintering is carried out at about 450°C. for about 2 hours.

4. A method for simultaneously forming Schottky-Barrier and ohmic contacts in a silicon substrate comprising
   - forming in one planar surface of said silicon substrate a first plurality of regions having maximum conductivity-determining impurity $C_0$'s of $10^{18}$ atoms/$cm^3$ and a second plurality of regions having conductivity-determining $C_0$'s greater than $10^{18}$ atoms/$cm^3$, forming an electrically insulative layer on said substrate, forming contacts through said insulative layer to said first and second pluralities of regions, depositing platinum layers in said contact holes, heating to form platinum silicide in said contact holes, depositing metallic layers consisting essentially of aluminum on said platinum silicide layers, and sintering the substrate at a temperature in the order of from 400° to 550°C. for at least 1 hour to form Schottky-Barrier contacts in the holes to said first plurality of regions and ohmic contacts in the holes to said second plurality of regions.

5. The method of claim 4 wherein said first plurality of regions are N type.

6. The method of claim 5 wherein said sintering is carried out at about 450°C. for about 2 hours.

7. A method of forming Schottky-Barrier contacts to a silicon surface comprising depositing a layer consisting essentially of platinum on said surface, heating to form a platinum silicide layer on a silicon substrate having a maximum conductivity-determining impurity $C_0$ of $10^{18}$ atoms/$cm^3$, depositing a metallic layer consisting essentially of aluminum and copper on said platinum silicide layer, and sintering the substrate at a temperature in the order of from 400° to 550°C. for at least 1 hour.

8. A method of forming Schottky-Barrier contacts to a silicon surface comprising depositing a layer consisting essentially of platinum on said surface, heating to form a platinum silicide layer on a silicon substrate having a maximum conductivity-determining impurity $C_0$ of $10^{18}$ atoms/$cm^3$, depositing a metallic layer consisting essentially of aluminum on said platinum silicide layer, depositing a layer of silicon on said metallic layer, and sintering the substrate at a temperature in the order of from 400° to 550°C. for at least 1 hour.

9. A method for simultaneously forming Schottky-Barrier and ohmic contacts in a silicon substrate comprising forming in one planar surface of said silicon substrate a first plurality of regions having maximum conductivity-determining impurity $C_0$'s of $10^{18}$ atoms/$cm^3$ and a second plurality of regions having conductivity-determining $C_0$'s greater than $10^{18}$ atoms/$cm^3$, forming an electrically insulative layer on said substrate, forming contacts through said insulative layer to said first and second pluralities of regions, depositing platinum layers in said contact holes, heating to form platinum silicide in said contact holes, depositing metallic layers consisting essentially of aluminum and copper on said platinum silicide layers, and sintering the substrate at a temperature in the order of from 400° to 550°C. for at least one hour to form Schottky-Barrier contacts in the holes to said first plurality of regions and ohmic contacts in the holes to said second plurality of regions.

10. A method for simultaneously forming Schottky-Barrier and ohmic contacts in a silicon substrate comprising forming in one planar surface of said silicon substrate a first plurality of regions having maximum conductivity-determining impurity $C_0$'s of $10^{18}$ atoms/$cm^3$ and a second plurality of regions having conductivity-determining $C_0$'s greater than $10^{18}$ atoms/$cm^3$, forming an electrically insulative layer on said substrate, forming contacts through said insulative layer to said first and second pluralities of regions, depositing platinum layers in said contact holes, heating to form platinum silicide in said contact holes, depositing metallic layers consisting essentially of aluminum on said platinum silicide layers, depositing a layer of silicon on said metallic layer, and sintering the substrate at a temperature in the order of from 400° to 550°C. for at least 1 hour to form Schottky-Barrier contacts in the holes to said first plurality of regions and ohmic contacts in the holes to said second plurality of regions.

* * * * *